United States Patent

Sato et al.

Patent Number: 5,285,088
Date of Patent: Feb. 8, 1994

[54] HIGH ELECTRON MOBILITY TRANSISTOR

[75] Inventors: Fumihiko Sato; Tsutomu Tashiro, both of Tokyo, Japan

[73] Assignee: NEC Corporation, Tokyo, Japan

[21] Appl. No.: 945,500

[22] Filed: Sep. 16, 1992

[30] Foreign Application Priority Data

Sep. 17, 1991 [JP] Japan .................. 3-235790

[51] Int. Cl.$^5$ ............ H01L 31/072; H01L 31/109; H01L 29/06; H01L 31/117
[52] U.S. Cl. ........................ 257/192; 257/194; 257/200; 257/19; 257/616
[58] Field of Search .......... 257/192, 194, 200, 201, 257/19, 24, 382, 616, 383, 384, 385

[56] References Cited

U.S. PATENT DOCUMENTS

| 4,677,735 | 7/1987 | Malhi | 257/382 |
| 5,155,571 | 10/1992 | Wang et al. | 257/19 |
| 5,187,379 | 2/1993 | Noda | 257/192 |

FOREIGN PATENT DOCUMENTS

0183995 6/1986 European Pat. Off. ........... 257/384

OTHER PUBLICATIONS

"High Hole Mobility in Modulation-Doped p-Si$_{0.5}$Ge$_{0.5}$/Ge/Si$_{1-x5}$Ge$_{x5}$ Hetrostructures Fabricated Using Molecular Beam Epitaxy", by Eiichi Murakami et al., Extended Abstracts of the 21st Conference on Solid State Devices and Materials, Tokyo 1989, pp. 373-376.
"Ultra High Hole Mobility In Strain-Controlled Si-Ge Modulation-Doped FET", E. Murakami et al., IEEE, IEDM 90, 1990, pp. 375-378.
"Si/SiGe p-Channel MOSFETs", by S. Subbanna et al., 1991 VLSI Technology 11-1, pp. 103-104.

Primary Examiner—Rolf Hille
Assistant Examiner—Wael Fahmy
Attorney, Agent, or Firm—Burns, Doane, Swecker & Mathis

[57] ABSTRACT

A semiconductor device capable of reducing element sizes exceedingly and a mask alignment accuracy in lithography is provided. This device has a pair of semiconductor layers for source/drain electrodes formed on the field insulating film so as to be respectively partially projected in a "overhanging-shape" over the active area. For example, using an MBE method, a selectively epitaxial growth is made with these semiconductor layers as nuclei, so that first and second semiconductor layers at the interface of which a channel is formed and a pair of semiconductor layers for source and drain electrode connections can be formed. Accordingly, the semiconductor heterojunction and gate electrode can be formed in self-alignment on the active area with the semiconductor layers pair for source/drain electrodes as the reference, so that a reduction in transistor size can be realized. It is preferable that the first semiconductor layer and second semiconductor layer making a heterojunction are made of an undoped monocrystalline SiGe layer and a monosilicon layer inverse in electroconductive polarity to the substrate, respectively. The semiconductor layers for source/drain electrode connections are preferable to have a two-level structure made of a polycrystalline SiGe layer and a polysilicon layer.

15 Claims, 5 Drawing Sheets

HIGH ELECTRON MOBILITY TRANSISTOR

BACKGROUND OF THE INVENTION

1. Field of the Invention

This invention relates to a semiconductor device and its production method and more particularly, to a high mobility field effect transistor utilizing a two-dimensional electron gas or two-dimensional hole gas formed at a heterojunction interface thereof and its production method.

2. Description of the Prior Art

A conventional high mobility field effect transistor having a heterojunction interface is shown in FIG. 1, which is, excepting a gate electrode, disclosed in the Extended Abstracts of the 21st. Conference on Solid State Devices and Materials, Tokyo, 1989, pp. 373-376. In that abstracts, the gate electrode is not shown and as a result, the operation of the field effect transistor itself is not made clear. However, if a gate electrode 7 is disposed between ohmic electrodes 6 on a cap layer 5 as shown in FIG. 1, this transistor operates as a junction field effect transistor utilizing a two dimensional hole gas.

In FIG. 1, on a Ge substrate 1 of the (100)-direction, a SiGe layer 2 as a buffer layer, a Ge layer 3 as a channel layer, a Ga-doped $Si_{0.5}Ge_{0.5}$ layer 4 and a cap layer 5 are formed in this order. On the cap layer 5, the two electrodes 6 are formed at spaces in an ohmic contact, which respectively become a source electrode and a drain electrode, and a gate electrode 7 is formed between the ohmic electrodes 6. The two dimensional hole gas is formed at the interface between the Ge layer 3 and Ga-doped $Si_{0.5}Ge_{0.5}$ layer 4.

With the conventional field effect transistor as shown above, when to be produced, the source and drain electrodes and the gate electrode are required to be positioned using different masks in respective lithography processes. As a result, when the transistor is intended to be produced smaller in size, it is limited by the mask alignment accuracy in each lithography, thus arising such a problem that the size cannot be reduced so as to exceed that accuracy.

Thus, an object of this invention is to provide a semiconductor device capable of reducing the size of elements so as to exceed the mask alignment accuracy in lithography and a production method of the same.

SUMMARY OF THE INVENTION

In a first aspect of this invention, a semiconductor device is provided, which comprises a semiconductor substrate of a first conductive-type, an active area formed on the surface of the substrate by a field insulating film provided thereon, a first pair of semiconductor layers of a second conductive-type inverse in conductive polarity to the first conductive-type for source and drain electrodes formed on the field insulating layer so as to have respective one parts projected over the active area, the first pair of semiconductor layers having a space between the confrontingly projected ends thereof over the active area, a first semiconductor layer formed on the active area and a second semiconductor layer formed on the first semiconductor layer, the first and second semiconductor layers making a heterojunction and having a channel formed at the interface therebetween by a two-dimensional gas, a third semiconductor layer of the first conductive-type for gate electrode formed over the active area and electrically connected through the space provided between the confrontingly projected ends of the first pair of the semiconductor layers to the second semiconductor layer, a second pair of semiconductor layers of the second conductive-type for source and drain electrode connections formed over the active area between the first pair of semiconductor layers and the second semiconductor layer for providing an electrical connection therebetween, and a pair of insulating films formed between the third semiconductor layer and the second pair of the semiconductor layers for providing an electrically insulation therebetween.

In this aspect, the first pair of the semiconductor layer for source and drain electrodes are partially projected over the active area to make the so-called "overhanging-shape". As a result, for example, using a molecular beam epitaxy (MBE) method, a selectively epitaxial growth is made with these semiconductor layers as nuclei, so that the first and second semiconductor layers making a hetero-junction and the second pair of the semiconductor layers for source and drain electrode connections can be formed. In addition, the third semiconductor layer for gate electrode can be formed by the same selective epitaxial growth method through the space between the first pair of the semiconductor layers over the active area. As a result, the semiconductor heterojunction and gate electrode can be formed in a self-alignment on the active area with the first pair of the semiconductor layers as the reference, so that a reduction in element size exceeding the mask alignment accuracy in lithography can be realized.

It is preferable that the first and second semiconductor layers making a heterojunction is made of an undoped monocrystalline SiGe layer and a monosilicon layer inverse in conductive polarity to the substrate, respectively.

The first pair of the semiconductor layers are preferable to be a polysilicon layers pair each being inverse in conductive polarity to the substrate, and further preferable to include a silicide film made of a high melting-point metal.

The second pair of the semiconductor layers are preferable to have a two-level structure made of a polycrystalline SiGe layer and a polysilicon layer.

It is sufficient that the first pair of the semiconductor layers are formed on the field insulating layer so as to have at least one parts projected over the active area thereby forming a space in order to provide a gate electrode therebetween. As a result, the material and configuration of the layers are not specifically limited, thus being capable of being designed so as to be adapted to the structure and performances of a desired transistor.

In another preferred embodiment, a fourth semiconductor layer equal in conductive polarity to the substrate is partially formed in the second semiconductor layer making a heterojunction inverse in conductive polarity to the substrate. Thus partially formed fourth semiconductor layer different in conductive polarity is preferable to be realized by injecting an impurity doped in the third semiconductor layer using a thermal diffusion method thereinto. In this case, the third semiconductor layer for a gate electrode is preferable to be of a polycrystalline semiconductor film.

In a second aspect of this invention, a production method of the semiconductor device explained in the first aspect is provided, which comprises the steps of forming a field insulating film on the surface of a semiconductor substrate of a first conductive-type for forming an active area on the substrate surface, forming a first pair of semiconductor layers of a second conductive-type inverse in conductive polarity to the first conductive-type for source and drain electrodes on the field insulating film so that the pair of the semiconductor layers are partially projected over the active area thereby to form a space over the active area between the confrontingly projected ends thereof, forming a first semiconductor layer and a second semiconductor layer making a heterojunction and forming a channel by a two-dimensional gas at an interface therebetween on the active area in this order, forming a third semiconductor layer of the first conductive-type for a gate electrode over the active area so as to be electrically connected to the second semiconductor layer through the space formed between the confrontingly projected ends of the first pair of the semiconductor layers, forming a second pair of semiconductor layers of the second conductive-type for source and drain electrodes connections over the active area for providing an electrical connection between the first pair of the semiconductor layers and the second semiconductor layer, and forming a pair of insulating films for providing an electrical insulation between the third semiconductor layer and the second pair of the semiconductor layers.

It is preferable that the first and second semiconductor layers making a heterojunction, the third semiconductor layer for gate electrode, the first pair of the semiconductor layers for source and drain electrodes, the second pair of the semiconductor layers for source and drain electrode connections each is formed by an MBE method. However other methods than the MBE method such as an ultra-high vacuum CVD method may be employed.

In another preferred embodiment, the production method of this aspect further comprises a step for partially forming in the second semiconductor layer a fourth semiconductor layer equal in conductive polarity to the substrate. This step is preferably realized by injecting an impurity contained in the third semiconductor layer for a gate electrode using a thermal diffusion method thereinto. In this case, the third semiconductor layer is preferable to be of a polycrystalline semiconductor film.

BRIEF DESCRIPTION OF THE DRAWINGS

FIGS. 3A and 3B, FIGS. 4A and 4B and FIGS. 5A to 5D are explanatory drawings of a production method of the semiconductor device shown in FIG. 2, in which FIG. 3A is a top view showing the state that an n+-type polysilicon film and an $Si_3N_4$ film are formed as a field insulating film and pad insulating film, FIG. 3B cross-sectionally shows the state shown in FIG. 3A taken on the line A—A of FIG. 3A, FIG. 4A is a top view showing the state that a pair of n+-type polysilicon films for source and drain electrodes and an $Si_3N_4$ film formed thereon are patterned to form them in an overhanging shape, FIG. 4B cross-sectionally shows the state shown in FIG. 4A taken on the line B—B of FIG. 4A, and FIGS. 5A to 5D cross-sectionally sequentially show the processes to be taken after the process shown in FIGS. 4A and 4B has been finished.

DESCRIPTION OF THE PREFERRED EMBODIMENTS

Preferred embodiments of this invention will be described below by referring to FIGS. 2 to 6.

First Embodiment

Figure 1:
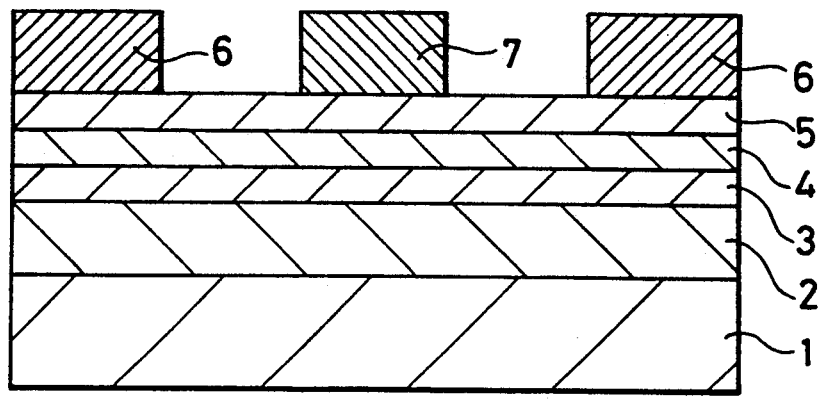
FIG. 1 is a cross-sectional view of a conventional semiconductor device.
Figure 2:
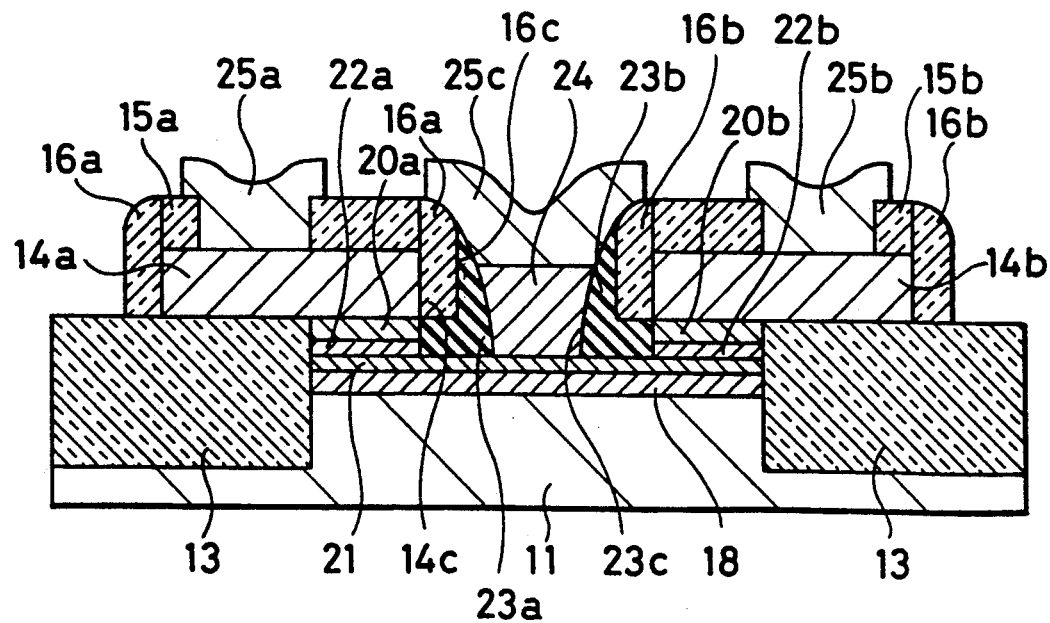
FIG. 2 is a cross-sectional view of a semiconductor device according to a first embodiment of this invention.

A semiconductor device according to a first embodiment of this invention is provided as shown in FIG. 2, in which a field $SiO_2$ film 13 is selectively formed on the surface of a p−-type monocrystalline silicon substrate 11 thereby to form an active area surrounded by the field $SiO_2$ film 13. In the active area, the surface of the substrate 11 is exposed from the field $SiO_2$ film 13. On the field $SiO_2$ film 13, a pair of n+-type polysilicon layers 14a and 14b for a source and drain electrodes pair are formed. Between the polysilicon layers 14a and 14b, a space 14c is formed, which is positioned substantially at the center of the active area. The polysilicon layers 14a and 14b respectively have substantially half parts projected on the side of the space 14c over the active area.

A pair of $Si_3N_4$ layers 15a and 15b are formed respectively on the pair of the n+-type polysilicon layers 14a and 14b. The side surfaces of the polysilicon layers 14a and 14b and those of the $Si_3N_4$ layers 15a and 15b are respectively covered with $Si_3N_4$ layers 16a and 16b as spacer layers.

On the bottom surfaces of the projected parts of the polysilicon layers 14a and 14b over the active area, a pair of n-type polycrystalline SiGe layers 20a and 20b and a pair of n+-type polysilicon layers 22a and 22b are respectively formed downward therefrom in this order. The n-type polycrystalline SiGe layers 20a and 20b and n+-type polysilicon layers 22a and 22b constitute semiconductor layers for source and drain electrode connections.

On the other hand, on the surface of the active area of the p−-type monosilicon substrate 11, an undoped mono-crystalline SiGe layer 18 and an n+-type monosilicon layer 21 are formed in this order. The monocrystalline SiGe layer 18 is formed so as to cover entirely the exposed surface of the substrate 11 and the monosilicon layer 21 is also formed so as to cover entirely the surface of the layer 18 thus formed. The pair of the n+-type polysilicon layers 22a and 22b are respectively electrically connected to the n+-type monosilicon layer 21 on the bottom surfaces of the projected parts of the pair of the polysilicon layers 14a and 14b over the active area. The undoped monocrystalline SiGe layer 18 and n+-type monosilicon layer 21 make a heterojunction and have a channel formed at the interface therebetween.

The side surfaces of the $Si_3N_4$ films 16a and 16b as spacer layers, polycrystalline SiGe layers 20a and 20b, and polysilicon layers 22a and 22b are respectively covered with a pair of the spacer insulating films 23a and 23b in the space 14c between the polysilicon layers 14a and 14b. The bottom surfaces of the spacer insulating films 23a and 23b are contacted to the surface of the n+-type monosilicon layer 21. Between the spacer insulating films 23a and 23b, a through-hole 23c is formed.

In the through-hole 23c, the surface of the n+-type monosilicon layer 21 is exposed between the spacer insulating films 23a and 23b.

Further, in the through-hole 23c, a p+-type monosilicon layer 24 becoming a gate electrode is formed, the bottom surface of which is contacted to the surface of the n+-type monosilicon layer 21 thereby providing an electrical connection therebetween. The p+-type monosilicon layer 24 has the side surface contacted to the spacer insulating films 23a and 23b.

The polysilicon layers 14a and 14b have aluminum-system electrodes 25a and 25b formed on their respective surfaces, the electrodes 25a and 25b being electrically connected to the polysilicon layers 14a and 14b through contact-holes formed in Si3N4 films 15a and 15b provided on the layers 14a and 14b, respectively. As with the poly-silicon layers 14a and 14b, one of the electrodes 25a and 25b forms one of the source electrode and drain electrode and the other thereof forms the other of the source and drain electrodes.

On the upper surface of the p+-type monosilicon film 24, an aluminum-system electrode 25c is provided, which is electrically connected through the through-hole 23c to the p+-type monosilicon layer 24. The electrode 25c constitutes a gate electrode together with the p+-type monosilicon layer 24.

Next, a production method of the semiconductor device shown above will be described below.

Figure 3A:
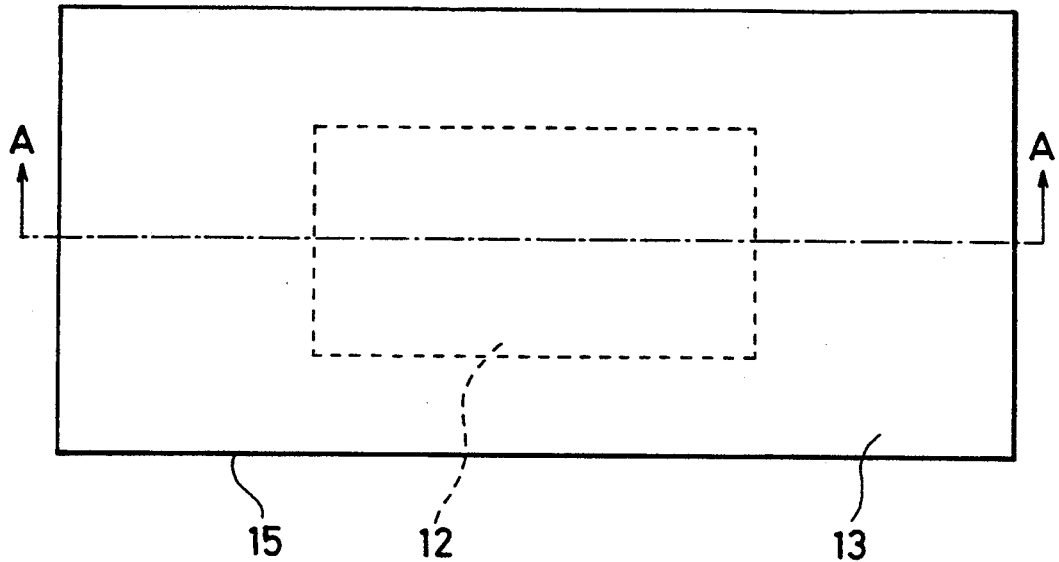
Figure 3B:
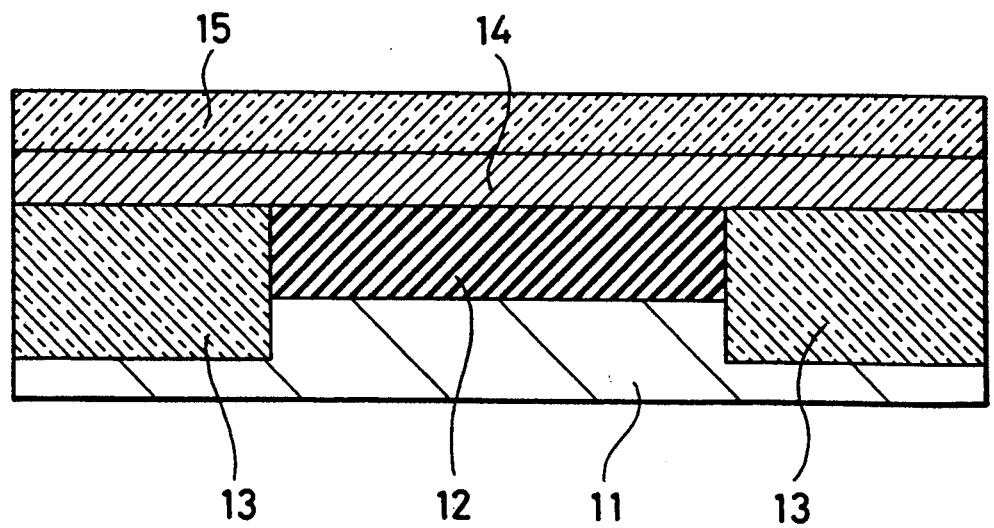

First, a pad SiO2 film 12 having a predetermined shape (rectangular in this embodiment) is formed in an area to be made as the active area of the surface of the p−-type monosilicon substrate 11, then, an Si3N4 film (not shown) is formed thereon and thereafter the surface of the substrate 11 is oxidized. Thus, the surface of the substrate 11 is selectively oxidized thereby forming the field SiO2 film 13 whose top-shape is of a rectangular doughnut form as shown in FIGS. 3A and 3B.

Next, the Si3N4 film formed on the pad SiO2 film 12 is removed and then, an n+-type polysilicon layer 14 is formed on the entire surface of the pad SiO2 film 12 and field SiO2 film 13. Thereafter, an Si3N4 film 15 is formed on the n+-type polysilicon layer 14, the state of which is shown in FIGS. 3A and 3B.

Figure 4A:
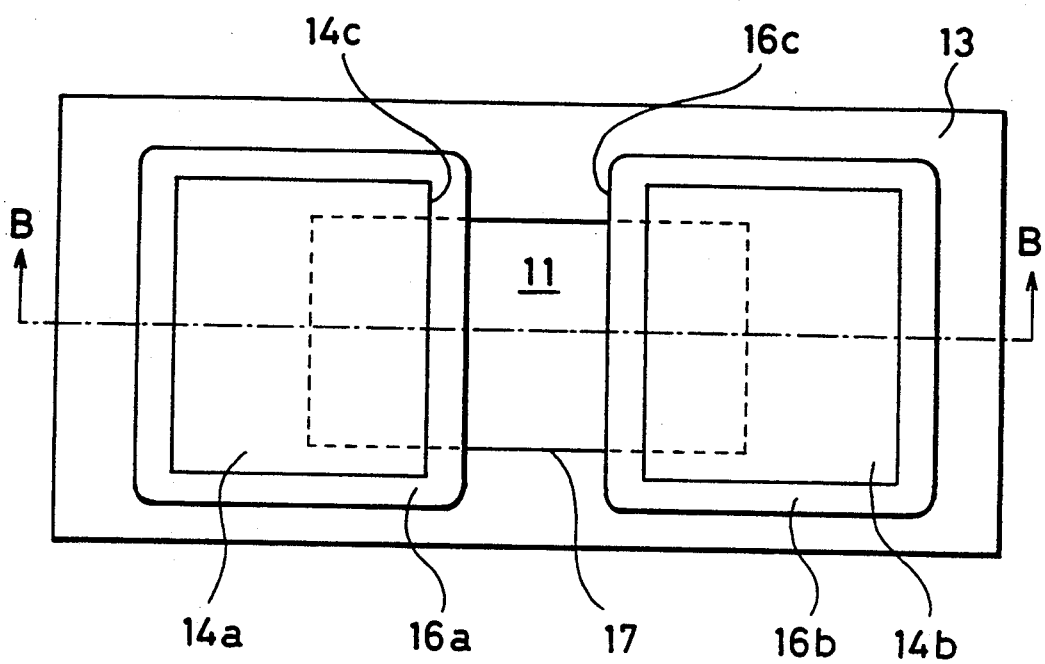
Figure 4B:
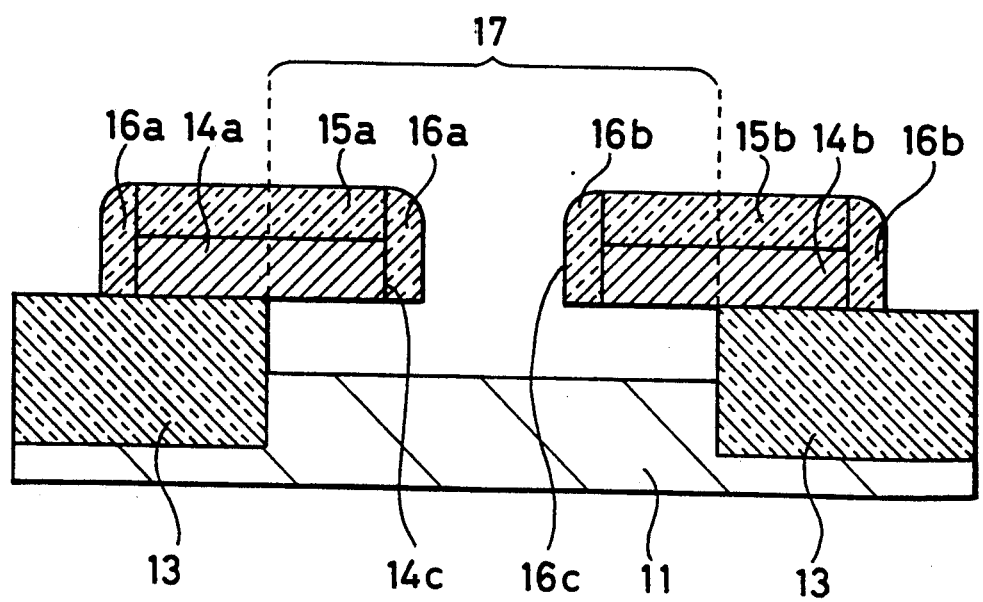

Subsequently, using the same photoresist film (not shown), the Si3N4 film 15 and n+-type polysilicon layer 14 are etched in this order thereby to be patterned respectively in the same shape. Thus, as shown in FIGS. 4A and 4B, on the field SiO2 film 13 are laminatedly formed the rectangular n+-type polysilicon layers 14a and 14b and the rectangular Si3N4 films 15a and 15b. Thus formed n+-type polysilicon layers 14a and 14b and Si3N4 films 15a and 15b respectively have substantially half parts projected over the active area. There exists the space 14c between the n+-type polysilicon layers 14a and 14b. The space 14c is formed over and centrically of the active area as shown in FIG. 4A. This means that the n+-type polysilicon layers 14a and 14b and as a result, the Si3N4 films 15a and 15b are disposed symmetrically with respect to the space 14c. The existence of the field SiO2 film 13 makes it possible to electrically insulate the n+-type polysilicon layers 14a and 14b with the p−-type monosilicon substrate 11. The n+-type polysilicon layers 14a and 14b are respectively employed as a source electrode and drain electrode.

Continuously, the photoresist mask is removed and then, a Si3N4 film is deposited on the entire surface thereof. Next, the Si3N4 film thus deposited is patterned by a well-known etching-back method thereby forming the pair of the Si3N4 films 16a and 16b as spacer layers on the side surfaces of the n+-type polysilicon layers 14a and 14b and the Si3N4 films 15a and 15b so as to surround them. Between the Si3N4 films 16a and 16b as a spacer layer, a space 16c is formed, which is placed over and centrically of the active area as shown in FIG. 4A.

Thereafter, the etching process is carried out to substantially selectively remove only the pad SiO2 film 12 on the active area utilizing the fact that the field SiO2 film 13 is enough larger in thickness than the pad SiO2 film 12. Accordingly, the surface of the substrate 11 is exposed thereby forming an opening portion 17 having a rectangular top-shape over the active area as shown in FIGS. 4A and 4B. In addition, in etching the SiO2 film, the pad SiO2 film 12 only may be etched using a photoresist mask having a through-hole at the position of the space 16C.

Figure 5A:
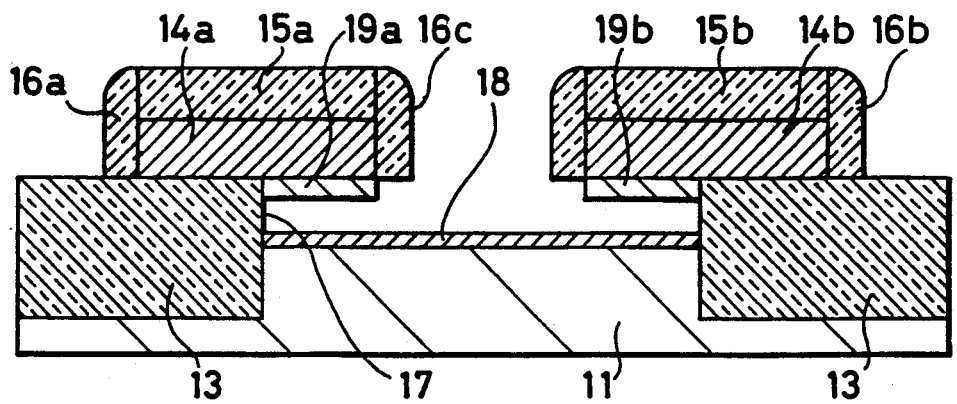

Next, the substrate 11 processed as shown in FIGS. 4A and 4B is introduced into a molecular beam epitaxy (MBE) unit equipped with a silicon gas source, then, heat-treated at 850° C. for about ten minutes thereby to remove the natural oxide film on the surface thereof. Thereafter, an undoped SiGe layer is epitaxially grown thereon under the growth conditions as a substrate temperature of 580° C., Si2H6 gas flow-rate of 7 sccm and Ge2H2 gas flow-rate of 1.0 sccm. As a result, as shown in FIG. 5A, an undoped monocrystalline SiGe layer 18 is selectively epitaxially grown upward from the surface of the P−-type monosilicon substrate 11 exposed to the opening portion 17, and on the bottom surfaces of the n+-type polysilicon layers 14a and 14b, undoped polycrystalline SiGe layers 19a and 19b are selectively grown in pair downward therefrom, respectively. The undoped monocrystalline SiGe layer 18 is formed over the entire surface of the active area, and the undoped polycrystalline SiGe layers 19a and 19b are formed over the entire bottom surfaces of the n+-type polysilicon layers 14a and 14b, respectively.

In this embodiment, the composition ratio of Si and Ge of the SiGe layer 18 and SiGe layers 19a and 19b is 7:3. The thickness of each of the SiGe films 18, 19a and 19b largely depends on the surface orientation of a substrate, gas flow-rates and the partial pressure of each gas, but, for example, the SiGe film 18 is about 50 nm thick and the SiGe layers 19a and 19b each is about 20 nm thick.

Figure 5B:
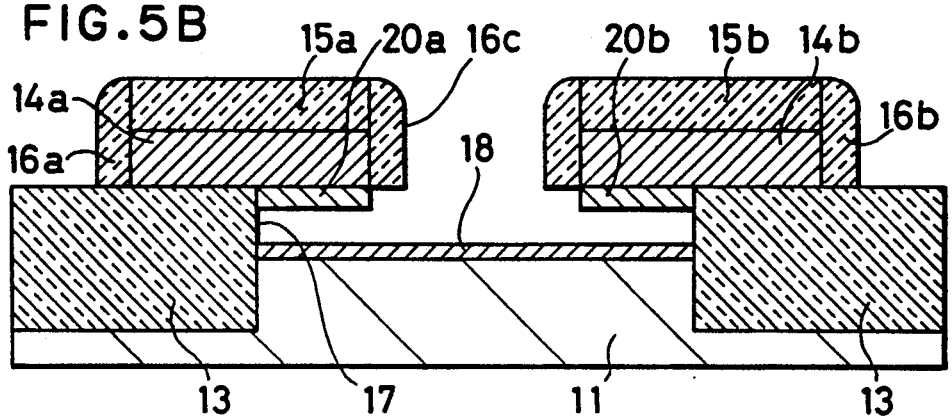

Next, the substrate 11 processed as shown in FIG. 5A is heat-treated in the MBE chamber at 900° C. for ten minutes thereby thermally diffusing an n-type impurity contained in the n+-type polysilicon layers 14a and 14b respectively into the undoped polycrystalline SiGe layers 19a and 19b. Thus, the intrinsic polycrystalline SiGe layers 19a and 19b are respectively transformed to the n-type polycrystalline SiGe layers 20a and 20b, the state of which is shown in FIG. 5B.

Subsequently, an n-type doping gas is introduced into the MBE chamber thereby growing the silicon epitaxially. As a result, the n+-type monosilicon layer 21 is grown epitaxially upward from the surface of the undoped monocrystalline SiGe layer 18, and the n+-type polysilicon layers 22a and 22b are selectively grown downward respectively from the bottom surfaces of the n-type polycrystalline SiGe layers 20a and 20b. Then, the upper surface of the monosilicon layer 21 comes into contact with the lower surfaces of the polysilicon layers 22a and 22b, the state of which is shown in FIG. 5C.

Here, the n+-type monosilicon layer 21, and n-type polysilicon layers 22a and 22b each is of about $1\times10^{18}$cm$^{-3}$ in impurity concentration, and respectively are of about 30 nm and 10 nm in thickness.

Figure 5C:
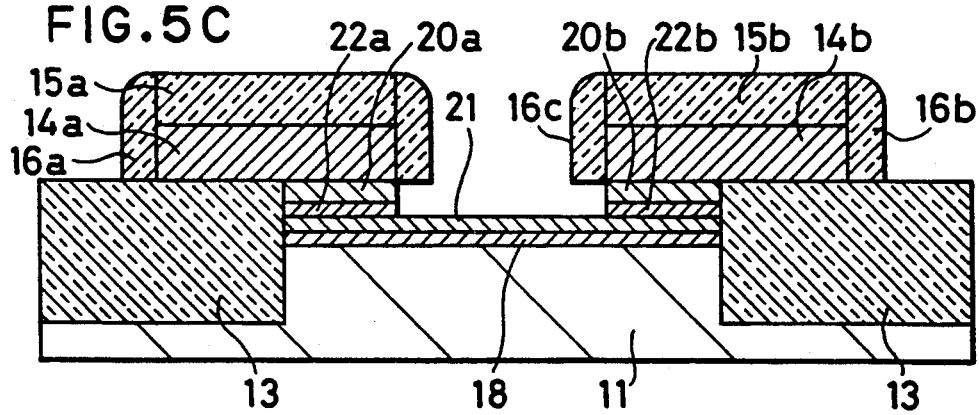
Figure 5D:
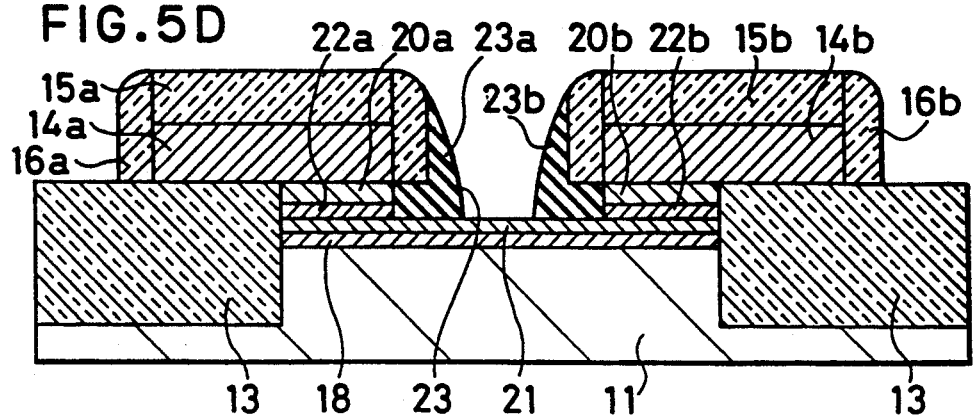

Next, the substrate 11 processed as shown FIG. 5C has an insulating film deposited over the entire surface thereof and patterned by a well-known etching-back method thereby forming the pair of the insulating layers 23a and 23b adjacently to the spacer Si$_3$N$_4$ films 16a and 16b as shown in FIG. 5D. The insulating films 23a and 23b respectively cover the side and bottom surfaces of the spacer Si$_3$N$_4$ films 16a and 16b, the side surfaces of the n-type polycrystalline SiGe layers 20a and 20b and the side surfaces of the n+-type polysilicon layers 22a and 22b. The insulating layers 23a and 23b form the through-hole 23c in which the n+-type monosilicon layer 21 has the surface exposed.

Next, as shown in FIG. 2, the p+-type monosilicon layer 24 is formed inside the through-hole 23c. The bottom surface of the p+-type monosilicon layer 24 is contacted with the upper surface of the n+-type monosilicon layer 21, thus being in an electrical connection with each other. Then, contact-holes are formed at predetermined positions of the Si$_3$N$_4$ films 15a and 15b formed on the polysilicon layers 14a and 14b, respectively. Next, the aluminium-system electrodes 25a and 25b becoming a source electrode and drain electrode are formed respectively thereon. As a result, the electrodes 25a and 25b have the bottom surfaces electrically connected through the contact-holes to the polysilicon layers 14a and 14b, respectively. The aluminium-system electrode 25c becoming a gate electrode is formed inside the through-hole 23c. The bottom surface of the electrode 25c is contacted with the top surface of the p+-type monosilicon layer 24 thereby making an electrical connection with each other. Consequently, the semiconductor device as shown in FIG. 2 can be obtained.

In this embodiment, in the n+-type monosilicon layer 21 which is selectively epitaxially grown, the electrons formed by ionization as an n-type impurity fall into the undoped monocrystalline SiGe layer 18 which is smaller in forbidden band width than silicon thereby generating two-dimensionally quantized electron gas. As a result, this semiconductor device has the same functions as those of field effect transistors known as a high electron mobility transistor (HEMT) utilizing AlGaAs/GaAs heterostructures. In addition, the transistors can be formed in self-alignment so that the reduction of the size of a transistor becomes possible to exceed the mask alignment accuracy in lithography, resulting in providing an effect adapted to integration.

Second Embodiment

Figure 6:
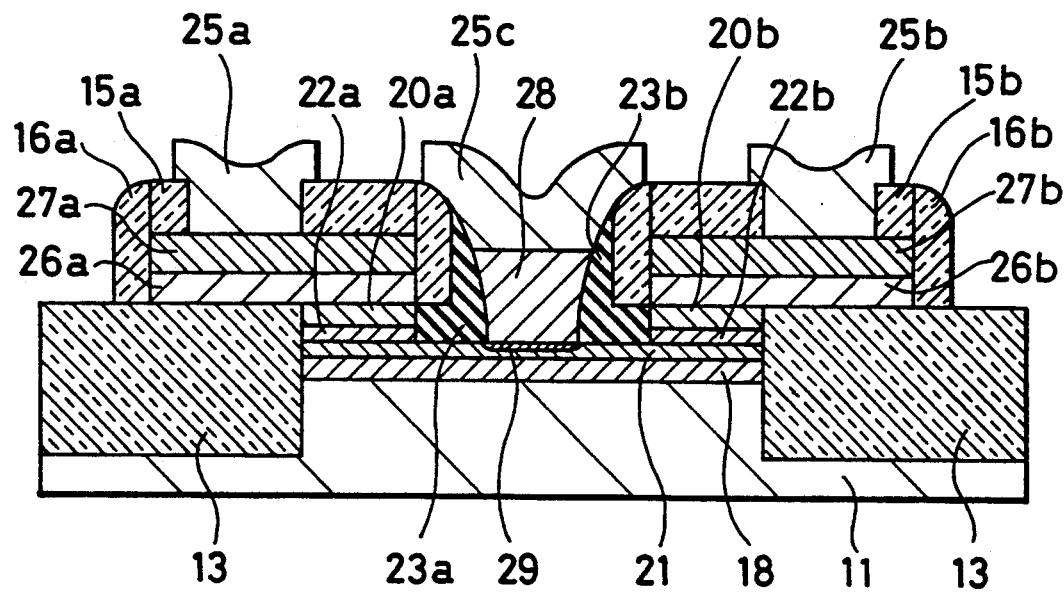
FIG. 6 is a cross-sectional view of a semiconductor device according to a second embodiment of this invention.

FIG. 6 shows a semiconductor device according to a second embodiment of this invention. The semiconductor device of this embodiment is identical in structure to that of the first embodiment excepting the two points as shown below. In FIG. 6, the components corresponding to those of the semiconductor device shown in FIG. 2 are indicated at the same reference numerals and letters and the explanations on the components common to each other will be omitted below. The semiconductor device of this embodiment can be produced by the substantially same method as that of the first embodiment.

This embodiment differs from the first embodiment in two points as follows:

The first difference is that the pair of the semiconductor layers for source and drain electrodes respectively have two-level structures made of the n+-type polysilicon layers pair 26a and 26b and WSi$_2$ films 27a and 27b formed thereon, though such pair of the semiconductor layers respectively have one-level structure made of the n+-type polysilicon layers pair 14a and 14b in the first embodiment. Using a silicide layer, which is an intermetallic compound, as shown above, the electrical resistance value at this part can be advantageously reduced as compared with the first embodiment.

The second difference is that the gate structure made of an p+-type polysilicon layer 28 is formed by selectively deposited in-situ doped polysilicon and a p+-type mono-silicon layer 29 formed in the n+-type monosilicon layer 21 by thermally diffusing a p-type impurity from the polysilicon layer 28, though it is made of the p+-type mono-silicon layer 24 only in the first embodiment. By being structured as above, it is advantageous in that the processes of bipolar transistors can be utilized.

In the above-mentioned embodiments, the explanations were made on junction field-effect transistors (JFET), but not limited thereto, this invention can be applied for other field effect transistors typically including MOSFET and MESFET, and further the kinds of heterojunction are not limited to the Si/SiGe junction exemplified in these embodiments, this invention can be applied for other kinds of heterojunctions. In case of making a MOSFET, for example, an insulating film may be formed on the bottom surface of the monosilicon layer 24 in the first embodiment, and in case of making a MESFET, for example, a metal film having a Schottky connection may be formed on the bottom surface of the monosilicon layer 24. In addition, referring to the source and drain electrode structure, this invention can be applied for other structures than those shown in these embodiments.

As described above, in the semiconductor device of each embodiment, the heterojunction by an epitaxial layer of an ultra-thin film can be selectively formed and the source and drain electrodes and gate electrode can be formed in self-alignment and as a result, an ultra high-speed field effect transistor utilizing a two-dimensional hole gas or a two-dimensional electron gas can be produced, so that a vast reduction in element size can be attained.

What is claimed is:

1. A semiconductor device, comprising:
   a semiconductor substrate of a first conductive-type;
   an active area formed on the surface of said substrate by a field insulating film provided thereon;
   a first pair of semiconductor layers of a second conductive-type opposite in conductive polarity to said first conductive-type for source and drain electrodes formed on said field insulating layer so as to have respective one parts projected over said active area, the first pair of semiconductor layers having a space between the confrontingly projected ends thereof over said active area;
   a first semiconductor layer formed on said active area and a second semiconductor layer formed on said first semiconductor layer, said first and second semiconductor layers being epitaxial layers extending between said first pair of semiconductor layers and making a heterojunction and having a channel formed at an interface therebetween by a two-dimensional carrier gas;

a third semiconductor layer of said first conductive-type for a gate electrode formed over said active area and electrically connected through said space provided between said confrontingly projected ends of said first pair of semiconductor layers to said second semiconductor layer;

a second pair of semiconductor layers of said second conductive-type for source and drain electrode connections formed over said active area between said first pair of semiconductor layers and said second semiconductor layer for providing respective electrical connections therebetween, said second pair of semiconductor layers being disposed under said first pair of semiconductor layers, respectively; and a pair of insulating films formed between said third semiconductor layer and said second pair of semiconductor layers for providing respective electrical insulations therebetween.

2. The semiconductor device as claimed in claim 1, wherein said first semiconductor layer making a heterojunction is an undoped monocrystalline SiGe layer and said second semiconductor layer making a heterojunction is a monosilicon layer of said second conductive-type.

3. The semiconductor device as claimed in claim 1, wherein said first pair of semiconductor layers for source and drain electrodes each includes a silicide film of said second conductive-type which is made of a refractory metal.

4. The semiconductor device as claimed in claim 1, wherein said first pair of semiconductor layers for source and drain electrode connections each includes a polycrystalline SiGe layer and a polysilicon layer of said second conductive-type.

5. The semiconductor device as claimed in claim 1, wherein a fourth semiconductor layer of said first conductive-type is partially formed in said second semiconductor layer, said second semiconductor layer being of said second conductive-type.

6. The semiconductor device as claimed in claim 5, wherein an impurity of said fourth semiconductor layer is injected by thermal diffusion of an impurity contained in said third semiconductor layer for a gate electrode.

7. The semiconductor device as claimed in claim 1, wherein said second pair of semiconductor layers are made of a plurality of stacked polysilicon layers.

8. The semiconductor device as claimed in claim 7, wherein said first pair of semiconductor layers are made of a polysilicon layer.

9. The semiconductor device as claim in claim 1, wherein said pair of insulating films are contacted with the surface of said second semiconductor layer, and said third semiconductor layer for said gate electrode is disposed between said pair of insulating films.

10. The semiconductor device as claimed in claim 9, wherein the side faces of said first pair of semiconductor layers are respectively surrounded by insulating spacers, and each of said pair of insulating films is respectively contacted with said second pair of semiconductor layers through an area just below said insulating spacers.

11. The semiconductor device as claimed in claim 1, wherein said heterojunction and said gate electrode are both formed self-aligned with said first pair of semiconductor layers over said active area.

12. A semiconductor device, comprising:

a monosilicon substrate of a first conductive-type;

an active area formed on the surface of said substrate by a field insulating layer provided thereon;

a pair of first polysilicon layers for source and drain electrodes of a second conductive type opposite in polarity to said first conductive-type formed on said field insulating layer so as to be partially projected over said active area thereby forming a space between the confrontingly projected ends thereof over said active area;

a non-doped monocrystalline SiGe layer formed on said active area;

a first monosilicon layer of said second conductive-type formed on said non-doped monocrystalline SiGe layer;

a pair of second polysilicon layers of said second conductive-type formed on said first monosilicon layer, said pair of second polysilicon layers having a space formed therebetween;

a pair of polycrystalline SiGe layers of said second conductive-type respectively formed on said pair of second polysilicon layers over said active area, said pair of polycrystalline SIGe layers having a space formed therebetween and having their surfaces contacted respectively to the bottom surfaces of said pair of first polysilicon layers;

a second monosilicon layer for a gate electrode of said first conductive-type contacted to said non-doped monocrystalline SiGe layer through said first monosilicon layer through the inside of the spaces between said pair of first polysilicon layers, said pair of second polysilicon layers and said pair of polycrystalline SiGe layers; and a pair of insulating films formed between said second monosilicon layer and said pair of second polysilicon layers and said pair of polycrystalline SiGe layers.

13. The semiconductor device as claimed in claim 12, wherein said field insulating film is a SiO$_2$ film.

14. The semiconductor device as claimed in claim 12, wherein an insulating film for a spacer composed of a Si$_8$N$_4$ film is formed so as to surround said pair of first polysilicon layers.

15. The semiconductor device as claimed in claim 12, wherein a silicide film made of a refractory metal is provided so as to be contacted to the surface of said pair of first polysilicon layers.

* * * * *